US008535879B2

United States Patent
Lensen et al.

(10) Patent No.: US 8,535,879 B2
(45) Date of Patent: Sep. 17, 2013

(54) STRUCTURING HYDROGELS

(75) Inventors: Marga Lensen, Aachen (DE); Martin Möller, Aachen (DE)

(73) Assignee: DWI an der RWTH Aachen e.V., Aachen (DE)

( * ) Notice: Subject to any disclaimer, the term of this patent is extended or adjusted under 35 U.S.C. 154(b) by 567 days.

(21) Appl. No.: 11/752,341

(22) Filed: May 23, 2007

(65) Prior Publication Data

US 2007/0286883 A1 Dec. 13, 2007

(30) Foreign Application Priority Data

Jun. 8, 2006 (EP) .................................. 06011868

(51) Int. Cl.
*C12Q 1/68* (2006.01)
*G01N 33/53* (2006.01)
*C12M 1/34* (2006.01)
*C12M 3/00* (2006.01)
*A61K 47/48* (2006.01)

(52) U.S. Cl.
USPC ......... 435/6.1; 435/7.1; 435/287.2; 525/54.1; 536/23.1

(58) Field of Classification Search
USPC ....... 435/6.1, 7.1, 287.2; 525/54.1; 536/23.1
See application file for complete search history.

(56) References Cited

U.S. PATENT DOCUMENTS

| 6,372,813 B1 * | 4/2002 | Johnson et al. ................ 522/114 |
| 2003/0223957 A1 * | 12/2003 | Schwartz et al. ........... 424/78.38 |
| 2006/0183166 A1 * | 8/2006 | Mayer et al. .................... 435/7.9 |
| 2007/0009572 A1 * | 1/2007 | Mary Chan et al. .......... 424/426 |

FOREIGN PATENT DOCUMENTS

| WO | 02/36342 | | 5/2002 |
| WO | 02/059590 | | 8/2002 |
| WO | 03/031066 | | 4/2003 |
| WO | WO 03/031066 | * | 4/2003 |
| WO | WO 2005/084191 | * | 9/2005 |

OTHER PUBLICATIONS

Suh et al, A simple soft lithographic route to fabrication of PEG microstructures for protein and cell patterning, 2004, Biomaterials, 25, 557-563.*
Revzin et al, Fabrication of PEG hydrogel microstructures using photolithography, 2001, Langmuir, 17, 5440-5447.*
European Search Report, Application No. EP 06 01 1868, dated Dec. 8, 2006.

* cited by examiner

*Primary Examiner* — Narayan Bhat
(74) *Attorney, Agent, or Firm* — Renner, Otto, Boisselle & Sklar, LLP

(57) ABSTRACT

The present invention relates to a method for the preparation of a surface structured bulk hydrogel bearing a topographic and chemical pattern, comprising the steps of:
(i) providing a primary master having a predetermined topographic pattern,
(ii) replicating said primary master by an elastomeric secondary master to obtain a secondary master with said predetermined topographic pattern in its inverse form,
(iii) replicating said secondary master by an imprintable curable material of hydrogel precursor molecules which are capable of forming a hydrogel once crosslinked by curing, and crosslinking said material to thereby yield a replica made of cross-linked bulk hydrogel bearing the topographic pattern identical to that of the primary master, and
(iv) functionalizing, particularly biofunctionalizing, the bulk hydrogel replica.

20 Claims, 4 Drawing Sheets

Crosslinking of isocyanate starPEGs in the presence of water.

Cross-linking of acrylate starPEGs upon UV-irradiation

L = ligand moiety
F = functionality
RG = reactive group
TG = transfer group

STRUCTURING HYDROGELS

The present invention relates to a method for the preparation of a surface structured bulk hydrogel bearing a topographic and chemical pattern, comprising the steps of:
(i) providing a primary master having a predetermined topographic pattern,
(ii) replicating said primary master by an elastomeric secondary master to obtain a secondary master with said predetermined topographic pattern in its inverse form,
(iii) replicating said secondary master by an imprintable curable material of hydrogel precursor molecules which are capable of forming a hydrogel once crosslinked by curing, and crosslinking said material to thereby yield a replica made of cross-linked bulk hydrogel bearing the topographic pattern identical to that of the primary master, and
(iv) functionalizing, particularly biofunctionalizing, the bulk hydrogel replica.

In particular, the method according to the present invention can further comprise the step of:
functionalizing the protrusions of the topographically structured bulk hydrogel ("inking"),
functionalizing the depressions of the topographically structured bulk hydrogel ("print-molding"), or
functionalizing the topographically structured bulk hydrogel with a chemical pattern via a metal template on either the primary or secondary master ("transfer-molding"),
to thereby specifically and locally functionalize the bulk hydrogel surface with a chemical pattern.

During the last decades, many cell biology investigations have been carried out at (bio)interfaces, often aimed at a better understanding of the influence of the substrate on cell adhesion, proliferation, migration and viability. A number of relevant questions have been addressed, for example which characteristics make a surface repellent for proteins and cells (so-called 'anti-fouling' properties). It is nowadays commonly accepted that hydrophilic, non-ionic and non-polar surfaces largely decrease the affinity of proteins to adsorb. This effect can be attributed to the absence of hydrophobic interactions of (parts of) the proteins with the surface. Cell-repellent surface coatings are of special interest for biomedical applications, where it is necessary to suppress the adhesion of macrophages on, for instance, implants, which causes inflammatory reactions.

Correspondingly, several biocompatible and non-adhesive coating materials have been developed. The most widely used material is based on the polymer polyethylene oxide (PEO), also known as polyethylene glycol (PEG). This polymer meets the above requirements for being anti-fouling, while it is also biocompatible and not cytotoxic. In addition, the material has the properties of a hydrogel, i.e. it is insoluble in water but has the capacity to take up large quantities of water. The hydrated (swollen) hydrogel resembles biological tissue to a large extent, which makes the material even more interesting for applications in tissue engineering. A number of methodologies to prepare PEG coatings have emerged in the literature. For example, the polymer can be grafted onto a surface by chemical reactions, or self-assembled monolayers (SAMs) can be formed by means of self-assembly of PEGylated molecules on metal (oxide) surfaces.

For biomedical applications, it is often desired to enable the adhesion of certain desired tissue cells (e.g. bone, skin or nerve cells), while the adsorption of cells leading to an immune-response is suppressed. That is the reason why specific biofunctionalities are introduced on otherwise cell-repellent surfaces. Such chemically patterned surfaces are also of great interest to study specific protein and cell adhesion in model systems.

2-D, flat surfaces can be decorated with biofunctionalities for specific biointeraction using several patterning techniques. Especially the soft lithography technique of microcontact printing (μ-CP) is often used, by which it is possible to create patterns of adhesive and anti-adhesive SAMs; see Y. N. Xia, G. M. Whitesides, *Angewandte Chemie-International Edition* 1998, 37, 551-575. Using this methodology, typically a thiol-functionalized biological receptor is printed on a gold substrate and the non-printed areas are backfilled with PEG-appended thiol-derivative to result in a pattern of cell-repellent and cell-binding domains. By using specific patterning methodologies, nanometer scale resolution has been demonstrated. Another example of a nanoscopic technique that is compatible with biomolecules, is dip-pen lithography.

Previously, the synthesis of several tailor-made hydrogels for the formation of coatings has been reported; cf. DE 103 32 849.1, DE 103 30 560.2, DE 102 03 937.2, and DE 102 16 639.0. The synthetic methodology is based on star-shaped PEG polymers (starPEGs). The six arms are composed of ethylene oxide and propylene oxide moieties in a ratio of 4:1. The hydroxyl end-groups can be functionalized in a subsequent step with a number of reagents. A library of different starPEGs has been synthesised, varying in molecular weight (i.e. 3000, 12000 or 18000 g/mole) and in the chemical functionalities, e.g. bearing hydroxyl, isocyanate, amine, silane, vinyl sulphone and acrylate end-groups.

Coatings of these hydrogels can be applied on flat surfaces by spin-coating. Depending on the surface and the experimental conditions, e.g. concentration, flat and homogeneous films are formed. The as such prepared starPEG coatings constitute an ideal, inert background for further biofunctionalization. The isocyanate-terminated starPEGs can react in situ with amine functions of (bio)molecules (e.g. proteins). This reactivity allows post-film modification over the whole surface area or locally by printing a reactive ink on the hydrogel films by means of micro contact printing (μCP); see T. Ameringer et al., Biomacromolecules 2005, 6, 1819-1823; J. Groll et al., Langmuir 2005, 21, 1991-1999, and 3076-3083.

SUMMARY

Up till now, the hydrogels have been developed for coating applications. However, certain biomedical applications such as tissue engineering would benefit greatly from bulk material having anti-fouling properties and predictable surface reactivity for bioapplications.

Accordingly, there still exists a strong need for a facile, cheap and large-scale structuring method for bulk hydrogels. Thus, it is an object of the present invention to provide an economic method for the preparation of a surface structured bulk hydrogel bearing a topographic and chemical pattern.

The solution to the above technical problem is achieved by providing the embodiments characterized in the claims.

In particular, there is provided a method for the preparation of a surface structured bulk hydrogel bearing a topographic pattern, comprising the steps of:
(i) providing a primary master having a predetermined topographic pattern,
(ii) replicating said primary master by an elastomeric secondary master to obtain a secondary master with said predetermined topographic pattern in its inverse form,
(iii) replicating said secondary master by an imprintable curable material of hydrogel precursor molecules which are capable of forming a hydrogel once crosslinked by curing, and crosslinking said material to thereby yield a replica made of cross-linked bulk hydrogel bearing the topographic pattern identical to that of the primary master, and (iv) functionalizing, particularly biofunctionalizing, the bulk hydrogel replica.

Particularly, the method according to the present invention includes the step of:

functionalizing the protrusions of the topographically structured bulk hydrogel ("inking"), functionalizing the depressions of the topographically structured bulk hydrogel ("print-molding"), or functionalizing the topographically structured bulk hydrogel with a chemical pattern via a metal template on either the primary or secondary master ("transfer-molding"), to thereby specifically and locally functionalize the bulk hydrogel surface with a chemical pattern.

The material of the primary master is not subject of any particular limitation. However, hard primary masters are of particular interest. Usually, the material of the primary master is selected from metals, metal oxides, inorganic composite materials, metal oxides, glass, or plastic, in particular silicon, graphite, diamond, glass, plexi glass, mica, titanium, gold, silver and their oxide derivatives and doped modifications.

The secondary master material is preferably selected from any soft material, including polydimethylsiloxane (PDMS), polyvinylidene fluoride (PVDF), agarose, polyacrylamide, cellulose acetate, poly(2-hydroxyethylmethacrylate) (pHEMA), polymethylmethacrylate (PMMA), perfluorinated polyether, polyhyaluric acid or mixtures thereof. More preferably, the secondary master material is selected from a perfluorinated polyether having a molecular weight in the range of 1000 to 5000 and terminated with methacrylate end groups (PFPE DMA).

Preferably, the imprintable curable material in step (iii) is a hydrogel precursor selected from agarose, polyacrylamide, cellulose acetate, poly(2-hydroxyethylmethacrylate) (pHEMA), poly(N-isopropylacrylamide) (pNIPAM), polyhyaluric acid, polyethyleneglycol (PEG), poly(lactic acid) (PLA), poly(L-lysine) (PLL), star-like polymers or mixtures thereof.

DETAILED DESCRIPTION

Figure 1:
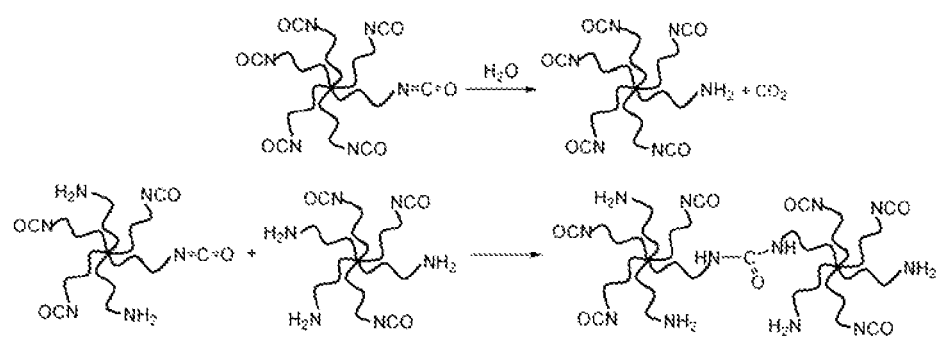
FIG. 1 is a reaction scheme showing crosslinking of isocyanate starPEGs in the presence of water, in accordance with an embodiment of the invention.

Star-like polymers are understood to be polymers which have several polymer chains bound to a low molecular weight central unit, the low molecular weight central unit generally having 4 to 100 skeletal atoms, such as C atoms, N atoms or O atoms. Accordingly, the star-like polymers used in accordance with the invention may be represented by the following general formula 1:

$$Z(A\text{-}B\text{---}R)n \quad (1)$$

in which n is an integer with a value of at least 4, for example 4 to 12, preferably 5 to 12 and more particularly 6 to 8;

Z is a low molecular weight n-functional organic residue as the central unit which generally has 4 to 100 and preferably 5 to 50 skeletal atoms, more particularly 6 to 30 skeletal atoms. The central unit may have both aliphatic and aromatic groups. For example, it stands for a residue derived from an at least tetrafunctional hydric alcohol, for example an alcohol bearing 4 to 12 alcohol groups, preferably at least 5 alcohol groups and more particularly 6 to 8 alcohol groups, for example pentaerythritol, dipentaerythritol, a sugar alcohol, such as erythritol, xylitol, mannitol, sorbitol, maltitol, isomaltulose, isomaltitol, trehalulose or the like;

A is a hydrophilic polymer chain which is soluble in water as such;

B is a chemical bond or a difunctional, low molecular weight organic residue containing preferably 1 to 20 and more particularly 2 to 10 carbon atoms, for example a C2-10 alkylene group, a phenylene group or a naphthylene group or a C5-10 cycloalkylene group; the phenylene, naphthylene or cycloalkylene group may additionally bear one or more, for example 1, 2, 3, 4, 5 or 6 substituents, for example C1-4 alkyl groups, C1-4 alkoxy groups or halogen; and R is a reactive group which is capable of reacting with a complementary reactive functional group R' or with itself to form a bond.

Reactive groups R in this context are groups which react with nucleophiles in an addition or substitution reaction, for example isocyanate groups, (meth)acryl groups, oxirane groups, oxazoline groups, carboxylic acid groups, carboxylic acid ester and carboxylic anhydride groups, carboxylic acid and sulfonic acid halide groups, but also the complementary groups reacting as a nucleophile, such as alcoholic OH groups, primary and secondary amino groups, thiol groups and the like. Examples of carboxylic ester groups are, in particular, so-called activated ester groups with the formula —C(O)O—X, where X represents pentafluorophenyl, pyrrolidine-2,5-dion-1-yl, benzo-1,2,3-triazol-1-yl or a carboxamidine residue.

Other suitable reactive groups R are radically polymerizable C=C double bonds, for example vinyl ether and vinyl ester groups besides the (meth)acryl groups mentioned above, activated C=C double bonds, activated C≡C triple bonds and N=N double bonds which react with allyl groups in an ene reaction or with conjugated diolefin groups in a Diels-Alder reaction. Examples of groups which are capable of reacting with allyl groups in an ene reaction or with dienes in a Diels-Alder reaction are maleic acid and fumaric acid groups, maleic acid ester and fumaric acid ester groups, cinnamic acid ester groups, propiolic acid (ester) groups, maleic acid amide and fumaric acid amide groups, maleic imide groups, azodicarboxylic acid ester groups and 1,3,4-triazoline-2,5-dione groups.

In a preferred embodiment, the star-like prepolymer has functional groups which are accessible to an addition or substitution reaction by nucleophiles. Such groups also include groups which react in a Michael reaction. Examples are, in particular, isocyanate groups, (meth)acryl groups (react in a Michael reaction), oxirane groups or carboxylic acid ester groups. A particularly preferred embodiment relates to star-like prepolymers which contain isocyanate groups as reactive groups R. In another embodiment, the prepolymer contains ethylenically unsaturated, radically polymerizable double bonds as reactive groups R.

Particularly, the star-like prepolymer has, on average, at least 4, for example 4 to 12, preferably at least 5 and more particularly 6 to 8 polymer arms. The number average molecular weight of the polymer arms is preferably in the range from 300 to 3,000 g/mol and more particularly in the range from 500 to 2,000 g/mol. Accordingly, the star-like prepolymer has a number average molecular weight of 2,000 to 20,000 g/mol and, more particularly, 2,500 to 15,000 g/mol.

The molecular weight may be determined in known manner by gel permeation chromatography using commercially available columns, detectors and evaluation software.

Where the number of terminal groups per polymer molecule is known, the molecular weight may also be determined by titration of the terminal groups—in the case of isocyanate groups, for example, by reaction with a defined quantity of a secondary amine, such as dibutylamine and subsequent titration of the excess amine with acid.

Adequate swellability by water is guaranteed by the solubility of the polymer arms A in water. Adequate swellability by water is generally guaranteed when the molecular structure, i.e. at least the nature of the recurring units and preferably also the molecular weight of the polymer arm, corresponds to a polymer of which the solubility in water amounts to at least 1% by weight and preferably to at least 5% by weight (at 25° C./1 bar).

Examples of such polymers with adequate solubility in water are poly-C2-4-alkylene oxides, polyoxazolines, polyvinyl alcohols, homopolymers and copolymers containing at least 50% by weight (co)polymerized N-vinyl pyrrolidone, homopolymers and copolymers containing at least 30% by weight (co)polymerized hydroxyethyl (meth)acrylate, hydroxypropyl(meth)acrylate, acrylamide, methacrylamide, acrylic acid and/or methacrylic acid, hydroxylated polydienes and the like.

In a preferred embodiment, the polymer arms A are derived from poly-C2-4-alkylene oxides and are selected in particular from polyethylene oxide, polypropylene oxide and polyethylene oxide/polypropylene oxide copolymers which may have a block or statistical arrangement of the recurring units. Star-like prepolymers of which the polymer arms A are derived from polyethylene oxides or from polyethylene oxide/polypropylene oxide copolymers with a percentage propylene oxide content of not more than 50% are particularly preferred.

The prepolymers used in accordance with the invention are partly known, for example from WO 98/20060, U.S. Pat. No. 6,162,862 (polyether star polymers), Chujo Y. et al., Polym. J. 1992, 24(11), 1301-1306 (star-like polyoxazolines), WO 01/55360 (star-like polyvinyl alcohols, star-like copolymers containing vinyl pyrrolidone) or may be produced by the methods described therein.

Accordingly, the imprintable curable material is more preferably a hydrogel precursor selected from starPEG hydrogels, which are end-capped with reactive groups, including hydroxyl, allyl, amine, isocyanate, cyano, carboxylate, anhydride, halide, silane, thiol, azide, activated ester, acrylate or aldehyde or mixtures thereof. Particularly, the starPEG has on average 6 to 8 polymer arms. More particularly, the starPEG has a number average molecular weight of 2,000 to 20,000 g/mol.

In a preferred embodiment of the present invention, the hydrogel precursor molecules are cross-linked in step (iii) by wet-chemical reactions.

In another preferred embodiment of the present invention, the hydrogel precursor molecules are cross-linked in step (iii) by photo-induced radical reactions (photo-curing).

Accordingly, bulk hydrogels to be employed in the present invention can be prepared by cross-linking of e.g. precursor starPEG molecules, of various formulations, such as amino-, carboxylate-, isocyanate-, acrylate- or silane-terminated starPEGs. For example, PEG-precursors bearing multiple acrylate or vinyl sulphone functions can be cross-linked with thiols taking advantage of Michael-type, or conjugate, additions. Results have shown that the resulting hydrogel networks are mechanically stable and insoluble in water, while it can take up water. In the case of structured hydrogels, the swelling should be limited in order not to disturb the pattern. Relying on the developed procedure to synthesize starPEGs as disclosed in DE 102 03 937.2, and DE 102 16 639.0, an excellent control over the number of cross-linking functionalities can be achieved and the length of the PEG-arms can be chosen freely. On top of that, because of the liquid nature of the starPEGs, the networking can be carried out in dilute or concentrated solutions or completely solvent-free. This aspect provides an additional tool to control the network density. Finally, the high functionalization degree of the starPEG precursor molecules enables to make cross-linked networks without the need for an additional cross-linking agent.

Hydrogel networks can be made from any starPEG precursor bearing chemically reactive groups. The hydroxyl endgroups of the starPEG arms can be functionalised with numerous chemical functionalities that can serve as reactant in cross-linking reactions. The reactive end-groups can be for example hydroxyl, allyl, amine, isocyanate, cyano, carboxylate, anhydride, halide, silane, thiol, azide, activated ester, acrylate, vinyl sulphone or aldehyde.

As mentioned above, particularly interesting end-group functionalities are isocyanate and (meth)acrylate. In the following, the cross-linking chemistries of isocyanate- and acrylate-functionalised starPEGs are exemplified. The isocyanate starPEGs react according to nucleophilic substitution reactions, while the acrylate starPEGs undergo radical reactions.

The isocyanate terminated starPEGs can be cross-linked by the administration of water, since the isocyanate moiety is hydrolysed by water to yield amino groups. These in turn can react to isocyanate functions of other starPEG macromolecules, forming urethane linkages (cf. FIG. 1).

Figure 2:
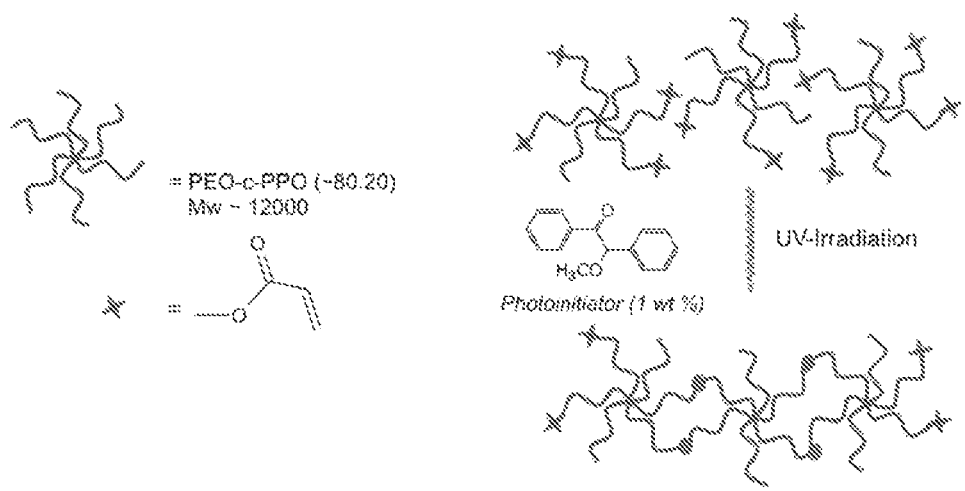
FIG. 2 is a reaction scheme showing crosslinking of acrylate starPEGs upon UV-irradiation, in accordance with an embodiment of the invention.

Acrylate and vinyl sulphone end-groups can be cross-linked by Michael-type additions to nucleophiles, such as bi- or multi-functional amines, thiols and alcohols. The acrylate-functionalised starPEGs can also be cross-linked through radical polymerisation upon illumination in the presence of a photoinitiator, and with or without additional cross-linking compounds (cf. FIG. 2). This starPEG variant can therefore be denoted as a UV-curable hydrogel. The cross-linking by means of photo-curing can be preferred over the wet chemical cross-linking because it is fast, simple, yields little side products, and results in a homogeneous network. Moreover, hydrogel starPEGs bearing reactive groups that are insensitive to the photo-induced radical reactions can be used, which results in post-curing reactivity.

After cross-linking, the hydrogels can be utilized as bulk material, with the particular advantage of having a reactive surface, because of the pending reactive groups. This post-networking reactivity of the bulk hydrogel material allows to perform post-cross-linking chemical patterning on the bulk hydrogel surfaces. In subsequent patterning of the bulk hydrogels, chemical compounds bearing reactive groups, for example hydroxyl, allyl, amine, isocyanate, cyano, carboxylate, anhydride, halide, silane, thiol, azide, activated ester, acrylate or aldehyde, can be chemically coupled to bulk hydrogels bearing surface reactive groups, for example hydroxyl, allyl, amine, isocyanate, cyano, carboxylate, anhydride, halide, silane, thiol, azide, activated ester, acrylate or aldehyde.

Specifically, the NCO starPEGs bearing isocyanate groups can be reacted with chemical reactants that are equipped with amine end-groups. This approach has been proven successful in the case of thin films of NCO starPEGs; see J. Groll et al., Langmuir 2005, 21, 3076-3083. It should be noted, however, that after the exposure to water in order to create cross-linked networks, that is, bulk hydrogels, the reactive end-groups at the surface may be cross-linked as well and few remain available for post-film functionalization.

In the specific case of acrylate starPEGs, the post-processing reactivity relies on the presence of residual hydroxyl end-groups that are present after the networking reaction. In a synthetic procedure to functionalize the hydroxyl end-groups of the above described starPEG starting compound with acrylate functions, not necessarily all six end-groups are converted. Because of the high functionality of the six arm starPEGs, it is for topological reasons in practice not feasible to react all endgroups. The reaction conditions can be tuned so that the overall conversion is typically about 60%, which means that—on an average—each starPEG molecule has 3 or 4 acrylate functionalities and 2 or 3 hydroxyl functions left. The hydroxyl groups are not affected by the UV-curing process. Thus, the cross-linked acrylate starPEGs retain post-curing reactivity due to the hydroxyl end-groups. These hydroxyl functions are randomly distributed within the bulk hydrogel, but are also present at the surface. This allows the chemical patterning of the bulk hydrogel surface.

The chemicals used in step (iv) are particularly selected from bio(macro)molecules, including (oligo)saccharides, glycosides, peptides, proteins, oligonucleotides, enzymes, RNA, DNA, and biofunctional receptors such as ligands, antigens and proteins bearing multiple interaction sites. More particularly, the chemicals used in step (iv) are selected from functional bio(macro)molecules, including receptor molecules for specific protein binding, low molecular weight protein ligands, particularly biotin, antibodies, growth factors or chemically modified derivatives thereof. In particular, certain peptide sequences that are common for extra cellular matrix (ECM) proteins can be applied in order to establish specific biointeraction with receptors embedded in the cell membrane. For example, the peptide sequences RGD or YIGSR, which are found in several ECM-proteins, e.g. fibronectin, vitronectin, laminin and collagen will induce binding of the proteins and subsequent cell binding. Other examples are the nickel-nitrilotriacetic acid (Ni-NTA) complex to bind any his-tag protein, and biotin derivatives to bind streptavidin, which in turn has binding sites left for subsequent binding of biotinylated biomolecules.

In one embodiment of the present invention, "inking" is performed by placing the topographically structured bulk hydrogel in close contact with a flat surface which is functionalized with bio(macro)molecules, so that after separation the protrusions are functionalized.

In another embodiment of the present invention the bio (macro)molecules are selectively deposited in the depressions of the topographically structured hydrogel.

In order to test the quality and feasibility of the applied patterning approach, several fluorescent or radioactive markers can be utilized to establish a pattern that is easily read out. The bulk hydrogels can be functionalized with chemical patterns consisting of cell adhesive molecules (CAMs) that will enable specific cell adhesion at designated positions and with a large control of the chemistry on the micro- and nano-meter scale.

Interestingly, several studies have revealed that not only the chemistry of the substrate, but also the topography may influence cell adhesion. On topographically patterned surfaces, even in the absence of any chemical functionalization, cells were found to align along the topographic grooves. In the present invention, the topographically patterned hydrogel substrates can be used to position and align living cells. These studies are of great interest, since there is very little known about cell adhesion on a globally cell-repellent but locally microstructured surface. These investigations will teach whether those kind of substrates as gained by the present invention will still be anti-adhesive for cells when they bear topographic structures with dimensions comparable to those of cells, or whether binding sites for specific protein adsorption and cell adhesion are required for living cells to 'get a grip'.

As addressed hereinabove the method according to the present invention aims to structure bulk hydrogel biointerfaces that retain post-patterning reactivity. The present invention further involves two procedures to perform simultaneous imprinting and chemical patterning of bulk hydrogels, denoted "print-molding" and "transfer-molding". These specific examples will be elaborated and discussed in more detail hereinbelow.

Figure 3:
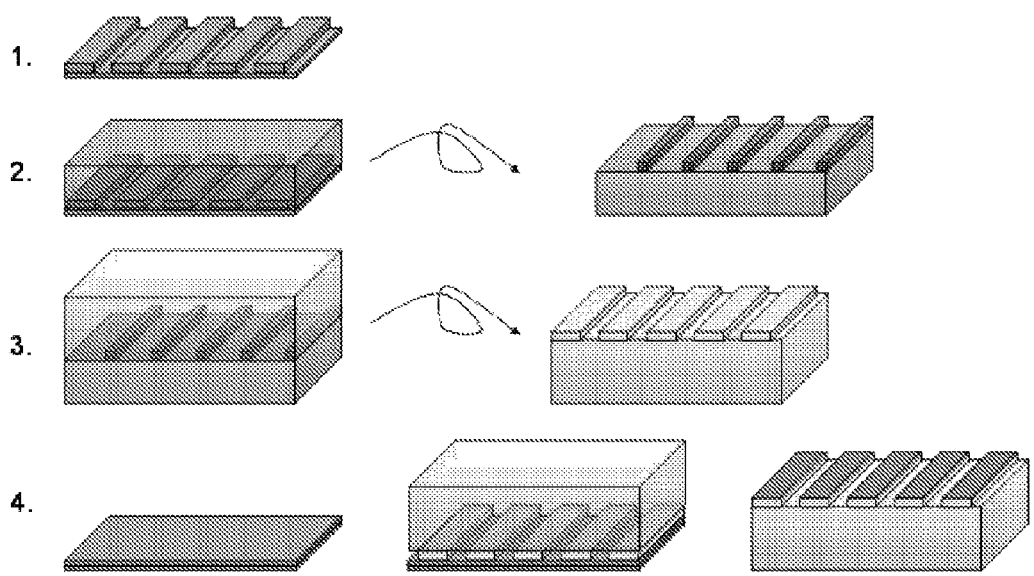
FIG. 3 is a schematic representation of a stepwise process to structure bulk hydrogels, in accordance with an embodiment of the invention.

FIG. 3 shows a schematic representation of the stepwise process to structure bulk hydrogels (3.) via a secondary master (2.), which is replicated from a primary (hard) master (1.). The bulk hydrogel substrate can be chemically functionalized by inking of the protrusions (4.).

As a very first step (FIG. 3, step 1.), a master structure is prepared. Hard, inert masters can be prepared from for example silicon, quartz, glass, mica, plexi glass, metal (e.g. gold, silver, titanium), metal oxide (titanium oxide), or plastic. These hard materials can be structured topographically by numerous established patterning techniques, such as photolithography, micro-contact printing (µ-CP), stencilling, replica molding or embossing, microtransfer molding (µTM), capillary force lithography (CFL), reactive ion etching (RIE), electron-beam lithography (EBL), scanning probe lithography (SPL), nano-imprint lithography (NIL), X-ray interference lithography or by procedures based on the transfer of a pattern formed by the self-organisation of for instance block copolymers or colloidal suspensions on a surface. The choice of the lithographic technique is based on the desired feature size (down to nm-resolution), area of the patterned surface, geometry of the features and expenses. Generally, nanofabrication by techniques such as EBL is more expensive than microfabrication.

In the second step (FIG. 3, step 2.), the (hard) primary master is replicated to yield an elastomeric replica. Since the resulting secondary master is used to imprint into the hydrogel in the next step, it should be inert and should be not or only negligibly swollen by the hydrogel precursor mixture, e.g. solvent or monomers. Particularly, an elastomeric mold in combination with a low surface energy ensures excellent release and replication quality.

Examples of soft mold materials include non brittle hydrophobic polymers, preferably crosslinked elastomers like perfluorinated polyether, polydimethylsiloxane (PDMS) or elastomeric polyolefines. Other examples are cellulosic triacetate, poly(meth)acrylates, polyvinylchloride, polyvinylidenchloride and polyvinylidenfluoride and their copolymers. The organosilicon elastomer PDMS is a useful material to produce elastomeric molds, because it is cheap and because the structuring procedures are well established.

Of particular interest is perfluorinated polyether (PFPE) as a mold material to fabricate sufficiently inert, soft 3D templates. This fluorinated polymer has appealing physical properties such as a very low surface energy and anti-adhesiveness, combined with a chemical inertness. The particular advantage of the latter is that not only the precursor molecules of the hydrogels and the functional components to be added but also the curing chemistry can be chosen freely, because they do not swell the mold. The low surface energy of the material makes it an excellent choice for a mold material, since the organic material will not stick to it. Moreover, the excellent mold release property eliminates any restrictions to the features on the primary master. Thus, a delicate and/or expensive master can be utilized as the primary master to make unlimited copies of the fluorinated secondary master, which is used as a mold for the imprinting into the bulk hydrogels. In particular, the anti-adhesive properties and flexibility of those perfluorinated polyethers (PFPE) will ensure an infallible release, first from the master and second from the hydrogel replica.

As a last step of the procedure (FIG. 3, item 3.), the elastomeric template is replicated by the hydrogel. The replication is performed according to imprinting, which requires a soft and deformable material, which hardens during the embossing. The hardening is preferably established by photocuring of the hydrogel bearing reactive groups that are activated by photoinitiators upon illumination, e.g. acrylates, as already mentioned above. The UV-curing results in a hydrogel, i.e. a cross-linked network, which is insoluble in water but can take up water. The hydrogel formulation should display only limited swelling by water. For example, this can be solved by choosing the optimal number of reactive groups and PEG-chain length as it is known for a skilled person. Another demand is a viscous nature of the precursor mixture. Following a solvent-free approach using in particular liquid starPEG precursors, a reproducible network formation in the mold is ensured. A hydrogel 3-D surface topology is thus generated.

The structured bulk hydrogel can be further functionalized by chemical patterning techniques, taking advantage of the post-curing reactivity of the material. The protrusions can be locally and specifically decorated with biofunctionalities by placing the substrate in close contact with a flat substrate bearing the chemical compound as ink (FIG. 3, item 4.). Nevertheless, it is of more interest to ink the depressions rather than the protrusions.

This can be achieved by introducing the chemical functionalities already in steps 1, 2 or 3, followed by transfer of the functionalities by replication. In step 1, the primary master can be decorated locally and specifically by means of various chemical patterning techniques, such as soft lithography, photolithography, dip-pen lithography, by sputtering a pattern of a functional metal, e.g. gold, and binding the functionalities to the gold template, by inking the protrusions, or by functionalizing the depressions, for example by capillary filling. Replication of the biofunctionalized primary master results in transfer of the functionalities onto the secondary master and later onto the hydrogel replica. In step 2, the secondary master can be decorated with functionalities as described for the primary master. Replication of the biofunctionalized secondary master by the bulk hydrogels results in transfer of the functionalities.

These specific methods to simultaneously transfer topographic and chemical patterns into the bulk hydrogel will be further exemplified hereinbelow.

Figure 4:
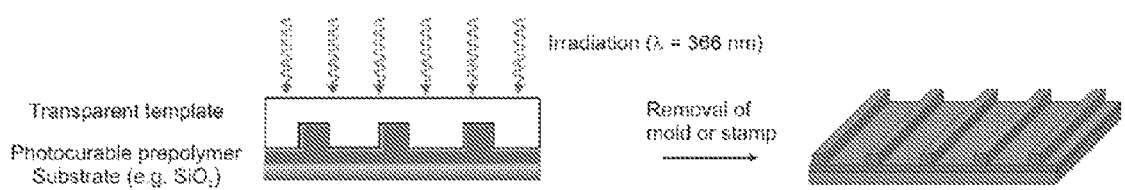
FIG. 4 depicts embossing a 3-D structure into a soft material and removing the mold after UV-curing of the material, in accordance with an embodiment of the invention.

Microstructured (silicon) masters are replicated by elastomers, for example PFPE DMA, PDMS, or cellulose acetate. The replication procedure involves immersing the master in the prepolymer mixture, subsequent curing (by UV-illumination, temperature or time) and peeling off the elastomeric replica (FIG. 3, step 1.). This process can be denoted micromolding. On a nanometer scale, the imprinting is carried out according to a process adapted from UV-based nanoimprint lithography (UV-NIL), using transparent (e.g. quartz) molds. Both micromolding and nanoimprinting are based on the principle of embossing a certain 3-D structure into a soft material and removing the mold after curing of the material. In the case of UV-curable elastomers, this replication method can be denoted UV-imprinting (FIG. 4).

The limitations of nanoimprinting do not lie in the theoretical limit of the features that can be written, e.g. by means of electron beam lithography (EBL), but rather in the practical problems such as adhesion of the different components. Notably, too strong adhesion to the mold leads to mold release problems and damage of the embossed structures. Generally, these problems are dealt with by treating the mold with release agents, e.g. fluorinated coatings, to decrease the sticking of the polymer to the mold. Alternatively, the resist material may contain fluorinated additives, which migrate to the surface and decrease the interaction with the mold. According to a preferred embodiment of the present invention, there is advantageously used a perfluorinated elastomer like PFPE DMA, which makes mold release agents superfluous and allows for nano-replication. To the contrary, PDMS cannot be properly used in the nanometer range.

Such a perfluorinated polyether (PFPE) derivative which can be used in the present invention is a polymer having a Mw in the range of about 1000 to 5000, particularly about 1900, and is usually equipped with methacrylate endgroups (Scheme 1 hereinbelow), which enables to use UV-imprinting as the technique of choice to structure the material, in a similar fashion as described for the UV-curable hydrogel.

Scheme 1. Synthesis of PFPE DMA

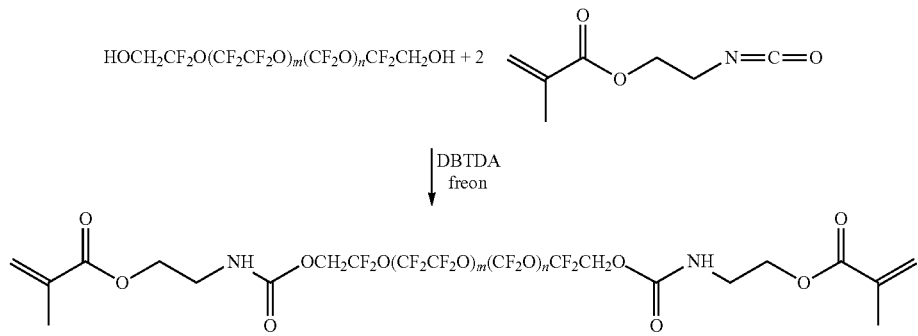

The PFPE DMA imprinted film may be supported by a substrate (as in FIG. 4) or is peeled off as a self-supportive elastomeric film. This kind of polymer material has the ability to replicate micro-structured masters, with an accuracy down to the nanoscale. The surface of the cured fluoropolymer is very hydrophobic (water contact angle 108°), anti-adhesive and chemically inert. Further properties of this material include its high elasticity, transparency, permeability for gases and the negligible swelling in (organic) solvents. Its low adhesion properties and the accurate nanoreplication drastically expand the scope of soft lithography methods and hold great promises for applications where PDMS fails due to its poor replication ability in the nanometer-regime or due to swelling or deformation during the imprinting process.

Nevertheless, other elastomeric materials may be chosen as a secondary master, since the polymeric nature of the hydrogel precursor material like starPEG and the solvent-free formulation will not affect the master structure, not even in the case of PDMS, which is notorious for its swelling behaviour in organic solvent and the concurrent loss of resolution of the topographic features.

Using this strategy to transfer the pattern of a hard master into the soft hydrogel by imprinting, bulk hydrogel replicas can be prepared.

Based on the experience that PEG-surfaces are protein- and cell-repellent, chemical functionalities can be introduced to the topographically structured bulk hydrogels and to unstructured hydrogels. The chemical and/or biological functionalities can be introduced in various manners. First, and most simply, the topographically structures bulk hydrogel can be placed into close contact with a flat surface containing reactive ink. The contact areas will accordingly be functionalised with the chemical or biological compounds (cf. FIG. 3, step 4.). However, it is more of interest for cell experiments to biofunctionalize the depressions rather than the protrusions.

In the course of the present invention topographic patterning, i.e. imprinting, can be easily be combined with chemical patterning, i.e. printing. This embodiment relies on the use of the elastomeric, secondary master both as a mold for imprinting and a stamp for printing. This simultaneous imprinting and printing can be denoted as "print-molding". Besides this technique, another technique denoted "transfer-molding", which relies on the transfer of biofunctionalities from the primary or secondary master onto the bulk hydrogel using a pattern of e.g. gold or any other metal as a template for the chemical pattern, has been adopted. These two patterning techniques represent low-cost, high throughput, few-step procedures that do not require clean room facilities, but can be largely carried out on the benchtop or in a moderate glovebox.

The technique of "print-molding" involves the preparation of molds for imprinting which are inked for printing, in order to imprint microstructures into the hydrogels and simultaneously functionalize the depressions chemically. As molds, there can be used an elastomeric, secondary master or the primary master directly, since the UV-curable hydrogel is easily peeled off from several divergent materials, i.e. PFPE DMA, PDMS and silicon, respectively. Nanostructured molds, however, constitute a larger surface area and have many more interaction points to which the imprintable material will stick. For replication of nanometer features, the fluoropolymer PFPE DMA can preferably be used as a secondary master, due to the combination of desired propensities, notably its low adhesion properties.

Figure 5:
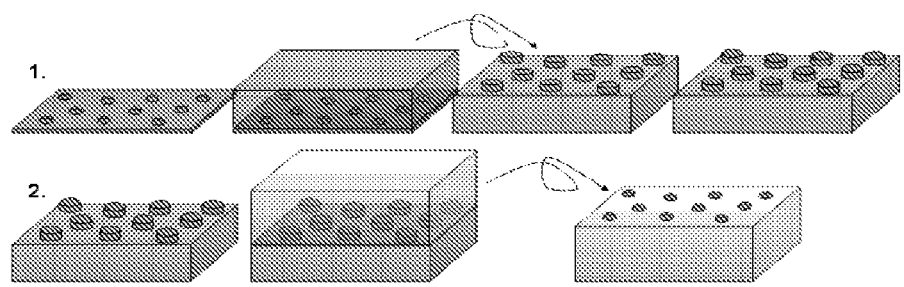
FIG. 5 depicts a procedure to perform simultaneous imprinting and printing into hydrogels, in accordance with an embodiment of the invention.

FIG. 5 depicts the schematic representation of the procedure to perform simultaneous imprinting and printing into the UV-curable hydrogels, denoted "print-molding". In particular, FIG. 5 shows the "print-molding" to fabricate microstructured hydrogels, containing both a topographic and a chemical pattern, involving the replication of the primary master (step 1.) by an elastomer to yield a secondary master which is inked as a stamp. In the last step, the secondary master (step 2.) is replicated by the bulk hydrogel.

Naturally, any kind of pattern is feasible, depending on the limitations of the master's design. Especially appealing structures include wells (as depicted in said FIG. 5) and patterns comprising a gradient in the density and/or the dimensions of the repeating structures.

Besides the above print-molding process, patterns can be transferred from a primary hard master via an elastomeric, secondary (sacrificial) master that bears a metal-templated chemical pattern. One of the specific examples of such a pattern has been established by the nanoscopic patterning with nanodots using block copolymer micelle nanolithography as disclosed in EP 05 019 237.6, WO 01/31402, and WO 99/21652, the contents of which are herein incorporated by reference. Accordingly, the method according to the present invention further comprises the combination of imprinting with pattern transfer from a metal template. This technique of simultaneous imprinting and pattern transfer can be denoted as "transfer-molding" and is explained in more detail in the following.

The technique of "transfer-molding" involves the preparation of molds for imprinting which bear a very specific pattern of (bio)functionalities, in order to imprint microstructures into bulk hydrogels and simultaneously functionalize the hydrogel substrates. For the locally controlled introduction of biofunctionalities, metal templates and supramolecular chemistry can be employed to bind biofunctionalities to the metal pattern. For example, thiol functionalized molecules bind specifically to gold. Highly developed tools to fabricate nano- and microsized metal structures include (photo)lithography, sputtering, and the controlled deposition of nano dot patterns. Subsequently, micro- and nano-structured arrangements of biofunctionalities will be prepared by chemisorption of suitable molecules on the metal pattern or alternatively, by micro-contact printing (μ-CP) on metal films, relying on the established knowledge to create self-assembled monolayers (SAMs). In the specific example of gold, it is well known that sulphur-containing molecules, e.g. thiols, disulfides, and dialkylsulfides, have an affinity to bind to the metal. Also other electron-rich donor ligands, such as amines, bind to gold, although less strongly. To prepare well defined molecular nanopatterns, the nanodot lithography technique can be adopted as for example disclosed in H. G. Boyen et al., Science 2002, 297, 1533-1536, and G. Kastle et al., Advanced Functional Materials 2003, 13, 853-861. This versatile methodology takes advantage of the supramolecular organisation of metal salt-loaded block copolymer micelles at interfaces, whose load can be converted into metal particles by plasma treatment, resulting in nanometer-sized metal dots. Without additional patterning procedures, the micelles organize themselves into a close-packed arrangement, which eventually results in hexagonal dot arrays (see FIG. 6). The nanodots can be prepared with a size of 1.5 to 5 nm, and at relatively regular interparticle distances that depend on the micelle diameter and can be chosen between 30 to 140 nm with a variance below 10-15%. The small size of the nanodots ensures that only a limited number of low molecular weight ligands can be bound to one dot and, most importantly, that only one single bioreceptor molecule can bind to the latter because of its size.

Figure 6:
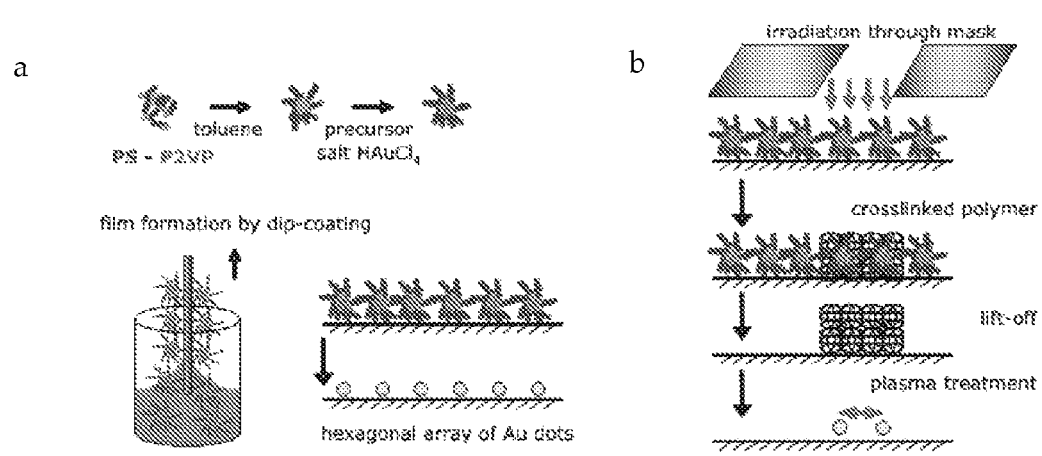
FIG. 6 depicts preparation and patterning of gold salt loaded block copolymer micelles into (a) periodic patterns of gold dots, in accordance with an embodiment of the present invention.

FIG. 6 shows a) the preparation of gold salt loaded block copolymer micelles, formation of thin films by dip-coating and eventual formation of the hexagonal pattern of gold dots by plasma treatment, and b) the patterning of the block copolymer micelles by photolithography, resulting in (a) periodic patterns of gold dots.

Periodic and aperiodic patterns can be written by optical lithography on the block copolymer micelles monolayer. When a high energy (UV-/electron-/ion-) beam is projected to the sample and a mask is applied, the nanodots are only deposited in the exposed regions, hence a pattern of dots is created (FIG. 6b). Upon subsequent functionalisation with biological ligands, this will result in biopatterns with fluctuating densities, that is, locally the ligands will be present in higher concentrations than on the surrounding areas of the substrate. By fine-tuning the interparticle spacing and the dimensions of the biopatterns, one can induce and manipulate the clustering of integrins.

In WO 2006/027274 A1 there is disclosed to transfer the nanodot pattern from a hard master into a soft replica. The procedure can be summarized as follows. First a nanodot pattern is fabricated on an inorganic (hard) master using the block copolymer micelle nanolithography method. Second, an organic (soft) film is prepared on top by coating the master with a precursor mixture, e.g. a viscous prepolymer or a solution of a polymer that hardens upon evaporation. The hardened, organic film is separated from the inorganic primary substrate. The separation can be done mechanically, or the inorganic substrate can be etched away. After separation, the nanodots are exposed at the surface of the soft and elastic film and are accessible for biofunctionalization.

The technique of "transfer-molding" as adopted in the course of the present invention resides in that a highly specific metal-templated pattern is transferred from a hard, inorganic master into the soft organic hydrogel replica via a secondary master. The use of a secondary master, preferably made of a PFPE mold, circumvents the incorporation of the inorganic or metallic nanodots in the final goal substrate, i.e. the bulk hydrogels. By this technique, the pattern of biofunctionalities is transferred into a biocompatible and anti-adhesive substrate without introducing the metal onto the eventual hydrogel substrate, which could invoke unwanted side-reactions or cytotoxicity. In the specific case of gold as the metal of choice, an additional advantage of eliminating the metal from the eventual goal biointerface, is that molecules bound to gold are not stable towards oxidation. In view of long-term stability it is therefore beneficial to transfer only the functionalities and not the gold template. The process of "transfer-molding" is depicted more elaborately in FIG. 7.

Figure 7:
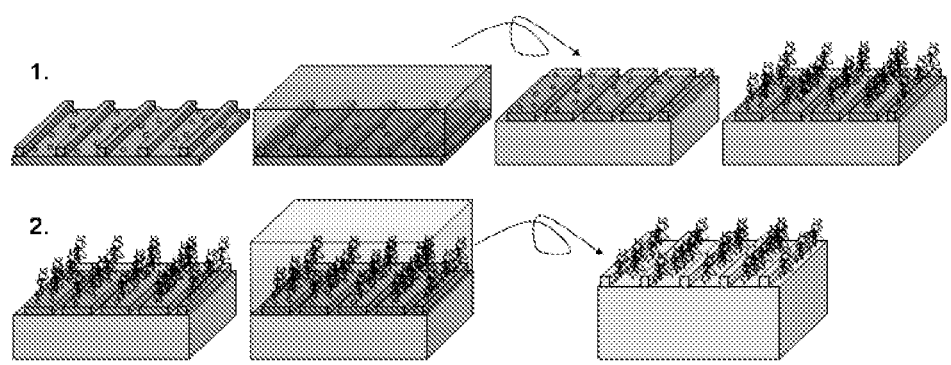
FIG. 7 depicts a process of "transfer-molding" in accordance with an embodiment of the present invention.

FIG. 7 shows a schematic representation of the concept denoted "transfer-molding", involving the replication of the primary master (step 1.) to yield an elastomeric, secondary master on which the gold template is functionalised. In step 2, the secondary master is then replicated by the hydrogel.

In order to transfer the functionalities (F), which are bound to the secondary master, into the hydrogel replica (cf. FIG. 8), there should be a distinct asymmetry in the two binding sites: the binding to gold should be relatively weak and in any case reversible, while the binding to the elastomer should be relatively strong and may be covalent. The strength of the gold binding motif (L) can be reduced by using weakly coordinating ligands, such as amines, instead of thiols.

Figure 8:
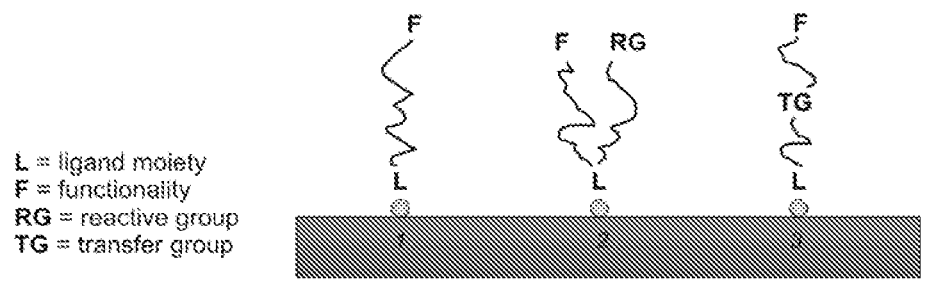
FIG. 8 shows a ligand design for transfer of functionalities into elastomeric replicas in accordance with an embodiment of the present invention.

FIG. 8 shows a ligand design for transfer of functionalities (F) into elastomeric replicas. In the simplest formulation (1), the functionality binds directly to the gold dots. A crosslinking, reactive group (RG) may be necessary to bind to the elastomer (upon curing) and assist the peel off step (2). A transfer facilitating group (TG) may be incorporated, which cleaves upon curing or upon heating (3).

For the covalent binding to the hydrogel upon curing, a reactive group (RG), is applied as an endgroup of the multifunctional ligand. This reactive group is for example hydroxyl, allyl, amine, isocyanate, cyano, carboxylate, anhydride, halide, silane, thiol, azide, activated ester, acrylate or aldehyde. When strongly metal-coordinating ligands are required, e.g. in order to optimize the gold surface coverage, use can be made of chemical entities within the ligand, which are cleaved chemically instead of (only) physically by pulling. Such an entity assists the transfer of the functionality and is therefore denoted as a transfer group (TG). There can be used transfer groups, which dissociate upon heating, for example azo-compounds, with the general structure R—N=N—R'. Upon heating the R—N bonds are cleaved and $N_2$ is released as a gas. In this ligand formulation (3, FIG. 8), the multifunctional ligand may be strongly bound to gold via thiols, since the ligand moiety (L) stays behind on the gold.

The invention claimed is:

1. A method for the preparation of a surface structured bulk hydrogel bearing a topographic and chemical pattern, comprising the steps of:
   (i) providing a primary master having a predetermined topographic pattern,
   (ii) replicating said primary master by an elastomeric secondary master to obtain a secondary master with said predetermined topographic pattern in its inverse form,
   (iii) replicating said secondary master by an imprintable curable material of hydrogel precursor molecules which are capable of forming a hydrogel once crosslinked by curing, and crosslinking said material to thereby yield a bulk hydrogel replica made of cross-linked bulk hydrogel bearing the topographic pattern identical to that of the primary master, and (iv) functionalizing the bulk hydrogel replica with a chemical pattern, wherein the functionalizing comprises the step of:

functionalizing the protrusions of the topographically structured bulk hydrogel ("inking"), functionalizing the depressions of the topographically structured bulk hydrogel ("print-molding"), or functionalizing the topographically structured bulk hydrogel with a chemical pattern via a metal template on either the primary or secondary master ("transfer-molding"), wherein the bulk hydrogel surface is specifically and locally functionalized with the chemical pattern, wherein the bulk hydrogel replica is a self-supporting elastomeric film, wherein the imprintable curable material in step (iii) is a hydrogel precursor selected from starPEG hydrogels which are end-capped with reactive groups selected from hydroxyl, allyl, amine, isocyanate, cyano, carboxylate, anhydride, halide, silane, thiol, azide, activated ester, acrylate or aldehyde or mixtures thereof, and wherein the starPEG has on average 6 to 8 polymer arms.

2. The method according to claim 1, wherein the primary master material is selected from a material including metals, metal oxides, inorganic composite materials, metal oxides, glass, or plastic, in particular silicon, graphite, diamond, glass, plexiglass, mica, titanium, gold, silver and their oxide derivatives and doped modifications.

3. The method according to claim 1, wherein the secondary master material is selected from anyone of crosslinked elastomers including perfluorinated polyether, polydimethylsiloxane (PDMS) or elastomeric polyolefines, cellulosic triacetate, poly(meth)acrylates, polyvinylchloride, polyvinylidenchloride or polyvinylidenfluoride or their copolymers.

4. The method according to claim 3, wherein the secondary master material is selected from a perfluorinated polyether having a molecular weight in the range of 1000 to 5000 and terminated with methacrylate end groups (PFPE DMA).

5. The method according to claim 1, wherein the starPEG has a number average molecular weight of 2,000 to 20,000 g/mol.

6. The method according to claim 1, wherein in step (iii) the hydrogel precursor molecules are cross-linked by wet-chemical reactions.

7. The method according to claim 1, wherein in step (iii) the hydrogel precursor molecules are cross-linked by photo-induced radical reactions (photo-curing).

8. The method according to claim 1, wherein the chemicals used in step (iv) are selected from bio(macro)molecules, including (oligo)saccharides, glycosides, peptides, proteins, oligonucleotides, enzymes, RNA, DNA, and biofunctional receptors.

9. The method according to claim 8, wherein the chemicals used in step (iv) are selected from functional bio(macro) molecules, including receptor molecules for specific protein binding, low molecular weight protein ligands.

10. The method according to claim 9, wherein the functional bio(macro)molecules comprise biotin, antibodies, growth factors or chemically modified derivatives thereof.

11. The method according to claim 8, wherein the bio (macro)molecules, including peptides, proteins, enzymes, oligonucleotides, RNA, DNA, oligosaccharides, and glycosides, are selectively deposited in the depressions of the topographically structured hydrogel.

12. The method according to claim 11, wherein said bio (macro)molecules are functional bio(macro)molecules, including receptor molecules for specific protein binding, low molecular weight protein ligands, biotin, antibodies, growth factors or chemically modified derivatives thereof.

13. The method according to claim 8, wherein the biofunctional receptors comprise ligands, antigens or proteins bearing multiple interaction sites.

14. The method according to claim 1, wherein said "inking" is performed by placing the topographically structured hydrogel in close contact with a flat surface which is functionalized with bio(macro)molecules, including peptides, proteins, enzymes, oligonucleotides, RNA, DNA, oligosaccharides, and glycosides, so that after separation the protrusions are functionalized.

15. The method according to claim 14, wherein said bio (macro)molecules are functional bio(macro)molecules, including receptor molecules for specific protein binding, low molecular weight protein ligands, biotin, antibodies, growth factors or chemically modified derivatives thereof.

16. The method according to claim 1, wherein in the "transfer-molding" a metal template is prepared on the primary master, said metal being selected from Au, Pt, Pd, Ag, In, Fe, Zr, Al, Co, Ni, Ga, Sn, Zn, Ti, Si and Ge in their elemental form or as oxides in their corresponding oxidation states or mixtures thereof.

17. The method according to claim 1, wherein the functionalizing comprises biofunctionalizing.

18. The method according to claim 1 wherein the bulk hydrogel replica is transparent.

19. The method according to claim 1 wherein the bulk hydrogel replica is permeable to gases.

20. A method for the preparation of a surface structured bulk hydrogel bearing a topographic and chemical pattern, comprising the steps of:

(i) providing a primary master having a predetermined topographic pattern, (ii) replicating said primary master by an elastomeric secondary master to obtain a secondary master with said predetermined topographic pattern in its inverse form, (iii) replicating said secondary master by an imprintable curable material of hydrogel precursor molecules which are capable of forming a hydrogel once crosslinked by curing, and crosslinking said material to thereby yield a bulk hydrogel replica made of cross-linked bulk hydrogel bearing the topographic pattern identical to that of the primary master, and (iv) functionalizing the bulk hydrogel replica with a chemical pattern, wherein the functionalizing comprises the step of:

functionalizing the protrusions of the topographically structured bulk hydrogel ("inking"), functionalizing the depressions of the topographically structured bulk hydrogel ("print-molding"), or functionalizing the topographically structured bulk hydrogel with a chemical pattern via a metal template on either the primary or secondary master ("transfer-molding"), wherein the bulk hydrogel surface is specifically and locally functionalized with the chemical pattern, wherein the bulk hydrogel replica is a self-supporting elastomeric film, is transparent and is permeable to gases, wherein the imprintable curable material in step (iii) is a hydrogel precursor selected from starPEG hydrogels which are end-capped with reactive groups selected from hydroxyl, allyl, amine, isocyanate, cyano, carboxylate, anhydride, halide, silane, thiol, azide, activated ester, acrylate or aldehyde or mixtures thereof, and wherein the starPEG has on average 6 to 8 polymer arms.

\* \* \* \* \*